United States Patent
Martinez, Jr.

(10) Patent No.: US 7,047,432 B1
(45) Date of Patent: May 16, 2006

(54) METHOD AND SYSTEM FOR SYNCHRONIZING OUTPUT FROM DIFFERENTLY TIMED CIRCUITS

(75) Inventor: Marvin W. Martinez, Jr., Plano, TX (US)

(73) Assignee: Cisco Technology, Inc., San Jose, CA (US)

( * ) Notice: Subject to any disclaimer, the term of this patent is extended or adjusted under 35 U.S.C. 154(b) by 505 days.

(21) Appl. No.: 10/347,084

(22) Filed: Jan. 17, 2003

(51) Int. Cl.
*G06F 1/12* (2006.01)
(52) U.S. Cl. .................. 713/400; 713/501; 713/502
(58) Field of Classification Search ............. 713/400, 713/501, 502
See application file for complete search history.

(56) References Cited

U.S. PATENT DOCUMENTS

| | | | | |
|---|---|---|---|---|
| 5,940,467 | A * | 8/1999 | Fransson ................. | 377/49 |
| 6,137,851 | A * | 10/2000 | Erickson et al. ........... | 375/372 |
| 6,189,115 | B1 | 2/2001 | Whetsel ................. | 714/28 |
| 6,205,142 | B1 * | 3/2001 | Vallee ................... | 370/394 |
| 6,256,760 | B1 | 7/2001 | Carron et al. ........... | 714/726 |
| 6,324,664 | B1 | 11/2001 | Farwell et al. .......... | 714/726 |
| 6,359,818 | B1 | 3/2002 | Suzuki ................. | 365/201 |
| 6,717,960 | B1 * | 4/2004 | Anesko et al. ........... | 370/536 |
| 6,748,039 | B1 * | 6/2004 | Bates ................... | 375/354 |
| RE38,619 | E * | 10/2004 | Paratore et al. .......... | 370/347 |
| 6,802,019 | B1 * | 10/2004 | Lauder ................. | 713/400 |

* cited by examiner

*Primary Examiner*—Chun Cao
*Assistant Examiner*—Vincent Tran
(74) *Attorney, Agent, or Firm*—Baker Botts L.L.P.

(57) ABSTRACT

Synchronizing output from timed circuits includes receiving a first clock signal having a first frequency at a first timed circuit. A first sequence of first circuit values is retrieved from the first timed circuit, and first count values are periodically inserted into the first sequence using a first counter. A second clock signal having a second frequency is received at a second timed circuit, where the first frequency corresponds to a multiple of the second frequency. A second sequence of second circuit values is retrieved from the second timed circuit and second count values are periodically inserted into the second sequence using a second counter. The first sequence can be synchronized with the second sequence according to the first count values, the second count values, and the multiple.

16 Claims, 2 Drawing Sheets

METHOD AND SYSTEM FOR SYNCHRONIZING OUTPUT FROM DIFFERENTLY TIMED CIRCUITS

TECHNICAL FIELD OF THE INVENTION

This invention relates generally to the field of digital electronic circuits and more specifically to a method and system for synchronizing output from differently timed circuits.

BACKGROUND OF THE INVENTION

Electronic devices often have circuits that are timed using clock signals of different frequencies. Typically, the circuits output circuit values that may be used to determine the behavior of the circuits. The circuit values, however, might not be synchronized, due to the differently timed circuits. Consequently, previous techniques for providing synchronized circuit output are unsatisfactory for some situations.

SUMMARY OF THE INVENTION

In accordance with the present invention, disadvantages and problems associated with previous techniques for synchronizing output may be reduced or eliminated.

According to one embodiment of the present invention, synchronizing output from timed circuits includes receiving a first clock signal having a first frequency at a first timed circuit. A first sequence of first circuit values is retrieved from the first timed circuit, and first count values are periodically inserted into the first sequence using a first counter. A second clock signal having a second frequency is received at a second timed circuit, where the first frequency corresponds to a multiple of the second frequency. A second sequence of second circuit values is retrieved from the second timed circuit and second count values are periodically inserted into the second sequence using a second counter. The first sequence can be synchronized with the second sequence according to the first count values, the second count values, and the multiple.

Certain embodiments of the invention may provide one or more technical advantages. A technical advantage of one embodiment may be that the circuit values from each circuit are tagged with count values associated with the frequency of a clock signal supplied to the circuit. A relationship between the frequencies of clock signals supplying different circuits is established. The circuit values are synchronized according to the relationship.

Certain embodiments of the invention may include none, some, or all of the above technical advantages. One or more other technical advantages may be readily apparent to one skilled in the art from the figures, descriptions, and claims included herein.

BRIEF DESCRIPTION OF THE DRAWINGS

For a more complete understanding of the present invention and its features and advantages, reference is now made to the following description, taken in conjunction with the accompanying drawings, in which.

DETAILED DESCRIPTION OF THE DRAWINGS

Figure 1:
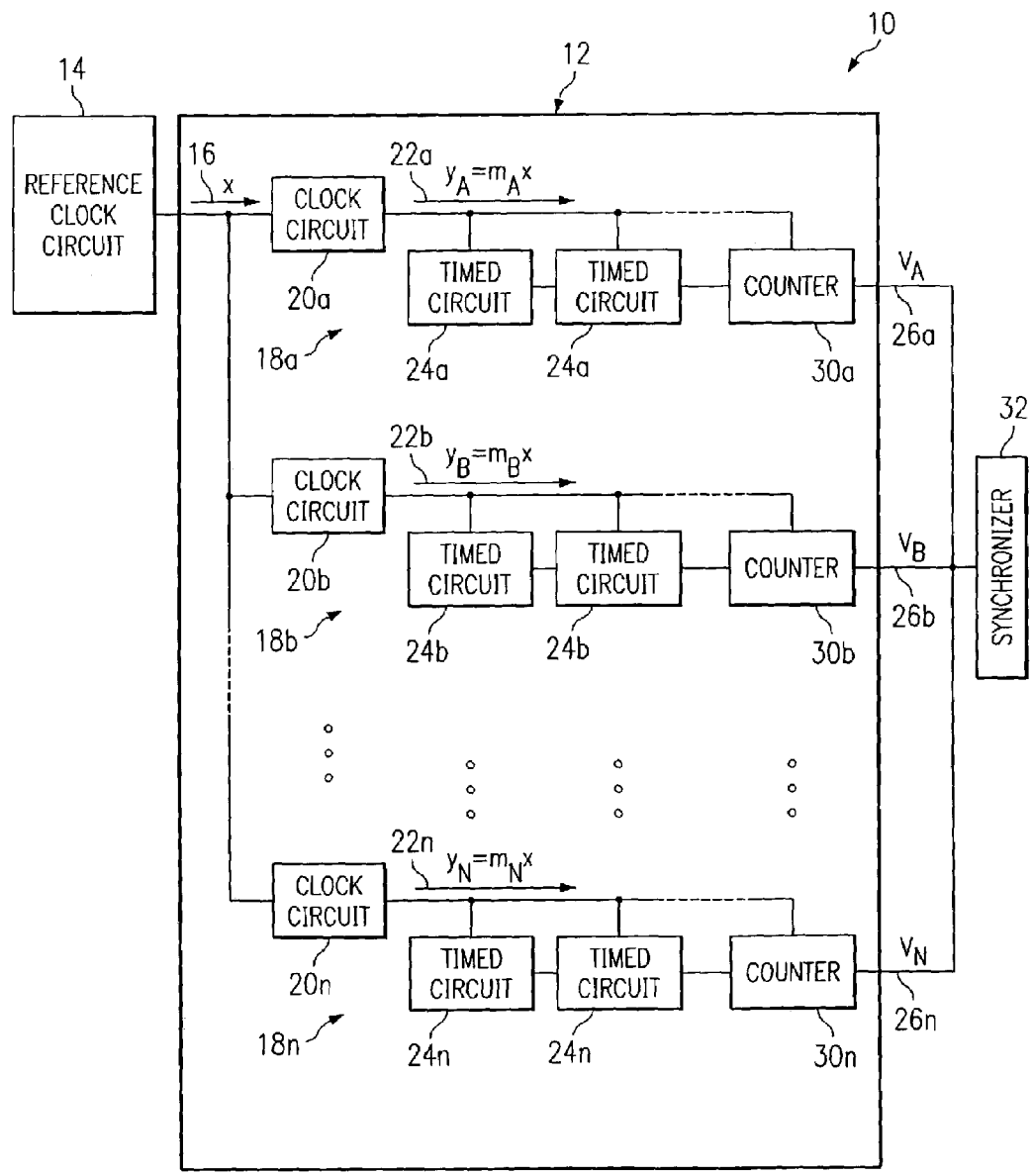
FIG. 1 is a block diagram illustrating one embodiment of a system for synchronizing output from timed circuits supplied by clock signals having different frequencies.
Figure 2:
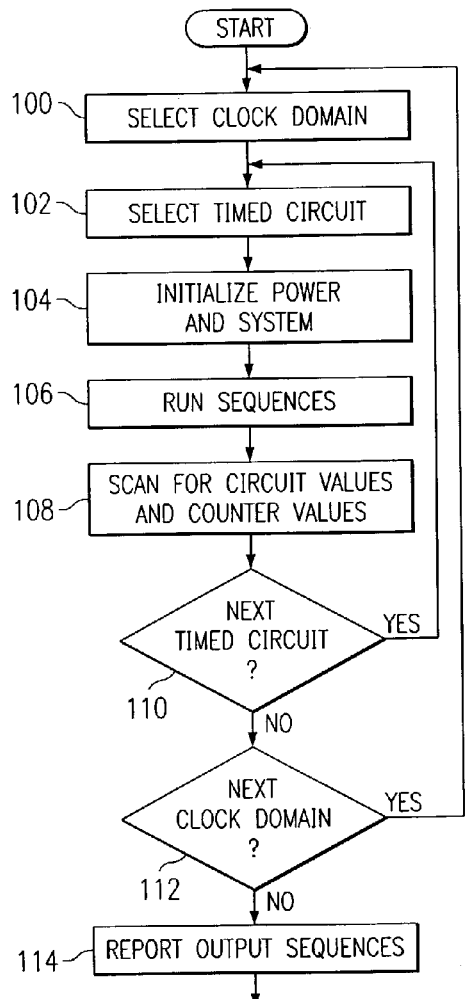
FIGS. 2 and 3 are flowcharts illustrating embodiments of methods for synchronizing output from timed circuits supplied with different clock signals.

Embodiments of the present invention and its advantages are best understood by referring to FIGS. 1 and 2 of the drawings, like numerals being used for like and corresponding parts of the various drawings.

FIG. 1 is a block diagram illustrating one embodiment of a system 10 for synchronizing output from timed circuits supplied by clock signals having different frequencies. System 10 includes a device 12 that has clock circuits that generate clock signals of different frequencies. A synchronizer 32 synchronizes circuit values generated by timed circuits supplied by the different clock signals.

Specifically, system 10 includes a reference clock circuit 14, device 12, and synchronizer 32. Reference clock circuit 14 generates a reference clock signal 16 having a frequency x. Device 10 includes a plurality of clock domains 18. Each clock domain 18 comprises a clock circuit 20 that supplies a clock signal 22 to one or more timed circuits 24. As used in this document, "each" refers to each member of a set or each member of a subset of the set. A clock circuit 20 generates clock signal 22 from a reference clock signal 16. Clock circuit 20 may comprise a phase-locked loop circuit or other suitable oscillating circuit, and timed circuit 22 may comprise a storage or processing circuit.

According to one example, clock circuit 20a may comprise, for example, a random-access memory (RAM) clock circuit. Clock signal 22a may have a frequency $y_A = m_A x$ that is a multiple $m_A$ of the frequency x of reference clock signal 16. Multiple $m_A$ may have a value of, for example, two. Multiple $m_A$, however, may have any suitable integer value such as integer $m_A$, $1 < m_A < 16$. Clock circuit 20a supplies clock signal 22a to timed circuits 24a for use by timed circuits 24a for timing.

According to one example, clock circuit 20b may comprise, for example, a system clock circuit. Clock signal 22b may have a frequency $y_B = m_B x$ that is a multiple $m_B$ of the frequency x of reference clock signal 16. Multiple $m_B$ may have any suitable integer value such as integer $m_B$, $1 < m_B < 16$. Clock circuit 20b supplies clock signal 22b to timed circuits 24b for use by timed circuits 24b for timing.

Each clock domain 18 includes a counter 30. The logic and counter 30 are serially linked into a scan chain 26. Scan chain 26 receives circuit values from the timed circuits 24 of the clock domain 18. The circuit values may comprise, for example, control or data functions. Counter 30 inserts count values among the circuit values to generate output sequences. The count values may correspond to the frequency of clock signal 22 from the associated clock circuit 20 of the clock domain 18. A count value may be inserted such that the count value is associated with circuit values generated substantially during the frequency cycle corresponding to the count value. For example, the count value may be inserted before or after the associated circuit values.

TABLE 1 provides an example of count values associated with circuit values.

TABLE 1

| | | | | |
|---|---|---|---|---|
| Count values for clock circuit 20a | 0 | 1 | ... | 100 |
| Circuit values from timed circuit 24a | $V_{A0}$ | $V_{A1}$ | ... | $V_{A100}$ |
| Count values for clock circuit 20b | 0 | 1 | ... | 100 |
| Circuit values from timed circuit 24b | $V_{B0}$ | $V_{B1}$ | ... | $V_{B100}$ |

According to TABLE 1, circuit values $V_{Ai}$ are associated with count values i for clock signal 22a from clock circuit 20a, and circuit values $V_{Bj}$ are associated with count values j for clock signal 22b from clock circuit 20b. If clock circuit 20a is not synchronized with clock circuit 20b, count values i are typically not synchronized with count values j, and thus circuit values $V_{Ai}$ are not synchronized with circuit values $V_{Bj}$. Resulting output sequences may comprise $V_A = V_{a0} 0 V_{a1} 1 \ldots V_{an} n$ for clock circuit 20a and $V_B = V^{b0} 0 V_{b1} 1 \ldots V_{bn} n$ for clock circuit 20b.

Synchronizer 32 aligns clock signals 22 according to offset b. Synchronizer 32 then synchronizes count values i for clock circuit 20a with count values j for clock circuit 20b, such that circuit values $V_{Ai}$ are synchronized with circuit values $V_{Bj}$. Synchronizer 32 synchronizes count values i with count values j by establishing an offset b describing a temporal offset between the clock signals 22, determining a multiple m describing the relationship between the frequencies of the clock signals 22, matching synchronous count values, and synchronizing the count values according to the multiple m and the offset b.

Offset b describes the temporal offset between the zero count values of the clock signals 22. Multiple m describes the relationship between the frequencies such as frequencies $y_A = m_A x$ and $y_B = m_B x$ of the clock signals 22a and 22b, respectively, according to the equation $y_A = m y_B$. Accordingly, multiple m may be determined according to the equation $m = m_A / m_B$. Synchronizer 32 matches synchronizing count values by determining a synchronizing count value for clock circuit 20a and a synchronizing count value for clock circuit 20b that are substantially synchronous with each other. A synchronizing count value may comprise, for example, an initial value.

Synchronizer 32 then synchronizes count values i associated with clock signal 22a having a frequency $y_A$ with count values j associated with clock signal 22b having a frequency $y_B$ using the multiple m. Each count value j is synchronized with a multiple m of count values i.

TABLE 2 provides an example of synchronized circuit values, where multiple m=2.

TABLE 2

| Count value for clock circuit A | 0 | 1 | 2 | 3 | ... | 100 |
|---|---|---|---|---|---|---|
| Circuit values from A-timed circuit | $V_{A0}$ | $V_{A1}$ | $V_{A2}$ | $V_{A3}$ | ... | $V_{A100}$ |
| Count value for clock circuit B | 0 | | 1 | | ... | 50 |
| Circuit values from B-timed circuit | $V_{B0}$ | | $V_{B1}$ | | ... | $V_{B50}$ |

According to TABLE 1, circuit values $V_{Ai}$ are associated with count values i for clock signal 22a from clock circuit 20a, and circuit values $V_{Bj}$ are associated with count values j for clock signal 22b from clock circuit 20b. Typically, count values i are not synchronized with count values j, so circuit values $V_{Ai}$ are not synchronized with circuit values $V_{Bj}$. Synchronizer 32 synchronizes count values i with count values j to synchronize circuit values $V_{Ai}$ with circuit values $V_{Bj}$. Synchronizer 32 may perform additional functions. For example, synchronizer 32 may evaluate timed circuits 24 in response to the synchronized circuit values.

Some of the modules of system 10 may be omitted or others added without departing from the scope of the invention. For example, device 12 may include more or fewer clock circuits 20, more or fewer timed circuits 24 and 26, or more or fewer counters 30.

FIG. 2 is a flowchart illustrating one embodiment of a method for generating output sequences from timed circuits 24 supplied with different clock signals 22. In general, count values corresponding to the frequencies of the clock signals 22 are inserted among the circuit values of timed circuits 24 in order to generate output sequences.

Specifically, the method begins at step 100, where a clock domain 18 is selected. A timed circuit 24 of the selected clock domain 20 is selected at step 102. The power and system of the selected time circuit 24 is initialized at step 104. Initializing the system may involve initializing clock stop controls using on-chip test features and trigger pins.

Sequences are run at step 106. For example, Joint Test Action Group (JTAG) or pattern sequences may be run. As sequences are run, count values corresponding to the frequencies of the clock signals 22 are inserted among the circuit values of timed circuits 24 in order to generate the output sequences. The sequences may be run past a finish time. Internally, the clocks may stop based on the clock stop controls, which may stop the clocks before the end of the sequences. The circuit values and counter values are scanned at step 108. The values for a clock domain 18 may be stored in a domain dump file.

If there is a next timed circuit of the clock domain 18 at step 110, the method returns to step 102 to select the next timed circuit 24. If there is no next timed circuit 24 of the clock domain 18 at step 110, the method proceeds to step 112. If there is a next clock domain 18 at step 112, the method returns to step 100 to select the next clock domain 18. If there is no next clock domain 18 at step 112, the method proceeds to step 114. The output sequences are reported at step 114. The output sequences may be reported by providing access to the domain dump files. After reporting the output sequences, the method terminates.

Figure 3:
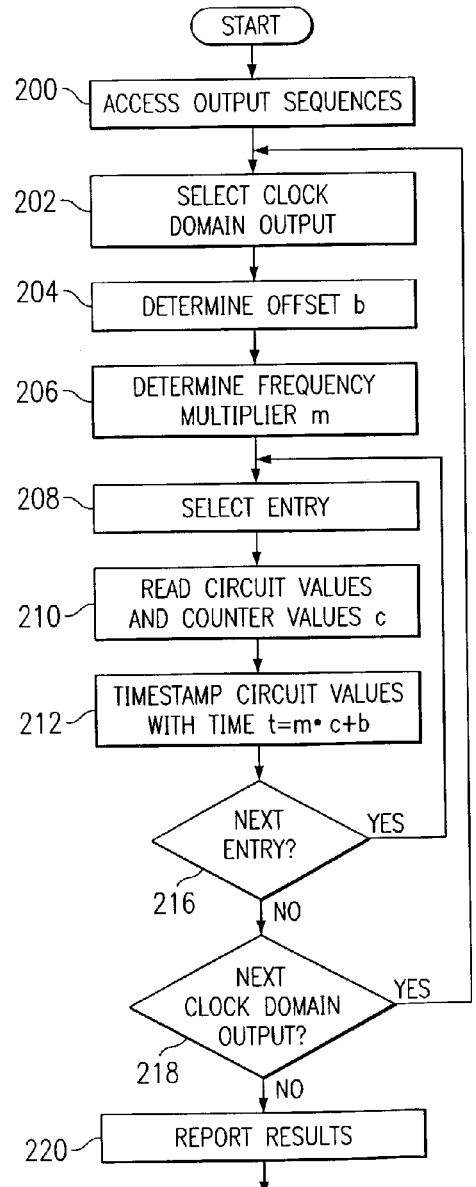

FIG. 3 is a flowchart illustrating one embodiment of a method for synchronizing output from timed circuits 24 supplied with different clock signals 22. In general, count values corresponding to the frequencies of the clock signals 22 are inserted among the circuit values of timed circuits 24 in order to generate output sequences. The output sequences are synchronized using the count values.

Specifically, the method begins at step 200, where output sequences are accessed. Output sequences may be stored according to the clock domain 18 that generated the output sequences. A clock domain output is selected at step 202. Clock domain output associated with a specific clock domain 18 may be stored in a domain dump file.

Offset b for the clock domain 18 is determined at step 204. Offset b describes the temporal offset between the zero count values of the output sequences. A frequency multiplier m for the clock domain output is determined at step 206. The frequency multiplier m describes the relationship between the frequencies of the clock signals 22.

An entry from the clock domain output is selected at step 208. Circuit values and counter values c are read from the entry at step 210. The circuit values are time stamped with time $t = m \sim c + b$ at step 212. The time stamped values are used to synchronize output from timed circuits 24 supplied with different clock signals 22.

If there is a next entry at step 216, the method returns to step 208 to select the next entry. If there is no next entry at step 216, the method proceeds to step 218. If there is a next clock domain output at step 218, the method returns to step 202 to select the next clock domain output. If there is no next clock domain output at step 218, the method proceeds to step 220 to report the results. The results may be reported by loading the results into a wave form viewer. After reporting the results, the method terminates.

Although an embodiment of the invention and its advantages are described in detail, a person skilled in the art could make various alterations, additions, and omissions without departing from the spirit and scope of the present invention as defined by the appended claims.

What is claimed is:

1. A method for synchronizing output from a plurality of timed circuits, comprising:
   receiving a first clock signal at a first timed circuit, the first clock signal associated with a first frequency;
   retrieving a first sequence of first circuit values from the first timed circuit;
   inserting a plurality of first count values periodically into the first sequence of first circuit values using a first counter, the first count values associated with the first frequency;
   receiving a second clock signal at a second timed circuit, the second clock signal associated with a second frequency, the first frequency corresponding to a multiple of the second frequency, the second frequency different from the first frequency;
   retrieving a second sequence of second circuit values from the second timed circuit;
   inserting a plurality of second count values periodically into the second sequence of second circuit values using a second counter, the second count values associated with the second frequency, the first sequence of first circuit values operable to be synchronized with the second sequence of second circuit values according to the first count values, the second count values, and the multiple.

2. The method of claim 1, wherein:
   inserting the first count values periodically into the first sequence of first circuit values using the first counter comprises inserting the first count values according to the first frequency; and
   inserting the second count values periodically into the second sequence of second circuit values using the second counter comprises inserting the second count values according to the second frequency.

3. The method of claim 1, further comprising synchronizing the first sequence of first circuit values and the second sequence of second circuit values according to the first count values, the second count values, and the multiple by synchronizing the first circuit values corresponding to a first count value with the second circuit values corresponding to a plurality of second count values according to the multiple.

4. The method of claim 1, further comprising:
   generating the first clock signal at a first clock circuit coupled to the first timed circuit; and
   generating the second clock signal at a second clock circuit coupled to the second timed circuit.

5. The method of claim 1, further comprising:
   receiving a reference clock signal at a first clock circuit and at a second clock circuit;
   generating the first clock signal from the reference clock signal at the first clock circuit; and
   generating the second clock signal from the reference clock signal at the second clock circuit.

6. The method of claim 1, further comprising evaluating the first timed circuit and the second timed circuit in response to the first sequence of first circuit values synchronized with the second sequence of second circuit values.

7. A method for synchronizing output from a plurality of timed circuits, comprising:
   receiving a first clock signal at a first timed circuit, the first clock signal associated with a first frequency;
   retrieving a first sequence of first circuit values from the first timed circuit;
   inserting a plurality of first count values periodically into the first sequence of first circuit values using a first counter;
   receiving a second clock signal at a second timed circuit, the second clock signal associated with a second frequency, the first frequency corresponding to a multiple of the second frequency;
   retrieving a second sequence of second circuit values from the second timed circuit;
   inserting a plurality of second count values periodically into the second sequence of second circuit values using a second counter, the first sequence of first circuit values operable to be synchronized with the second sequence of second circuit values according to the first count values, the second count values, and the multiple; and
   synchronizing the first sequence of first circuit values and the second sequence of second circuit values according to the first count values, the second count values, and the multiple by:
      determining a first synchronizing count value of the first sequence of first circuit values;
      determining a second synchronizing count value of the second sequence of second circuit values, the second synchronizing count value substantially synchronous with the first synchronizing count value; and
      synchronizing the first synchronizing count value and the second synchronizing count value.

8. A system for synchronizing output from a plurality of timed circuits, comprising:
   a first timed circuit operable to:
   receiving a first clock signal associated with a first frequency; and
   generate a first sequence of first circuit values;
   a first counter coupled to the first timed circuit and operable to insert a plurality of first count values periodically into the first sequence of first circuit values, the first count values associated with the first frequency;
   a second timed circuit operable to:
   receive a second clock signal associated with a second frequency, the first frequency corresponding to a multiple of the second frequency, the second frequency different from the first frequency; and
   generate a second sequence of second circuit values; and
   a second counter coupled to the second timed circuit and operable to insert a plurality of second count values periodically into the second sequence of second circuit values, the second count values associated with the second frequency, the first sequence of first circuit values operable to be synchronized with the second sequence of second circuit values according to the first count values, the second count values, and the multiple.

9. The system of claim 8, wherein:
   the first counter is operable to insert the first count values periodically into the first sequence of first circuit values by inserting the first count values according to the first frequency; and
   the second counter is operable to insert the second count values periodically into the second sequence of second circuit values by inserting the second count values according to the second frequency.

10. The system of claim 8, further comprising a synchronizer coupled to the first counter and the second counter and operable to synchronize the first sequence of first circuit values and the second sequence of second circuit values according to the first count values, the second count values, and the multiple by synchronizing the first circuit values corresponding to a first count value with the second circuit values corresponding to a plurality of second count values according to the multiple.

11. The system of claim 8, further comprising:
a first clock circuit coupled to the first timed circuit and operable to generate the first clock signal; and
a second clock circuit coupled to the second timed circuit and operable to generate the second clock signal.

12. The system of claim 8, further comprising:
a first clock circuit coupled to the first timed circuit and operable to:
receive a reference clock signal; and
generate the first clock signal from the reference clock signal; and
a second clock circuit coupled to the second timed circuit and operable to:
receive the reference clock signal; and
generate the second clock signal from the reference clock signal.

13. The system of claim 8, further comprising a synchronizer coupled to the first counter and the second counter and operable to evaluate the first timed circuit and the second timed circuit in response to the first sequence of first circuit values synchronized with the second sequence of second circuit values.

14. A system for synchronizing output from a plurality of timed circuits, comprising:
a first timed circuit operable to:
receiving a first clock signal associated with a first frequency; and
generate a first sequence of first circuit values;
a first counter coupled to the first timed circuit and operable to insert a plurality of first count values periodically into the first sequence of first circuit values;
a second timed circuit operable to:
receive a second clock signal associated with a second frequency, the first frequency corresponding to a multiple of the second frequency; and
generate a second sequence of second circuit values;
a second counter coupled to the second timed circuit and operable to insert a plurality of second count values periodically into the second sequence of second circuit values, the first sequence of first circuit values operable to be synchronized with the second sequence of second circuit values according to the first count values, the second count values, and the multiple; and
a synchronizer coupled to the first counter and the second counter and operable to synchronize the first sequence of first circuit values and the second sequence of second circuit values according to the first count values, the second count values, and the multiple by:
determining a first synchronizing count value of the first sequence of first circuit values;
determining a second synchronizing count value of the second sequence of second circuit values, the second synchronizing count value substantially synchronous with the first synchronizing count value; and
synchronizing the first synchronizing count value and the second synchronizing count value.

15. A system for synchronizing output from a plurality of timed circuits, comprising:
means for receiving a first clock signal at a first timed circuit, the first clock signal associated with a first frequency;
means for retrieving a first sequence of first circuit values from the first timed circuit;
means for inserting a plurality of first count values periodically into the first sequence of first circuit values using a first counter, the first count values associated with the first frequency;
means for receiving a second clock signal at a second timed circuit, the second clock signal associated with a second frequency, the first frequency corresponding to a multiple of the second frequency, the second frequency different from the first frequency;
means for retrieving a second sequence of second circuit values from the second timed circuit;
means for inserting a plurality of second count values periodically into the second sequence of second circuit values using a second counter, the second count values associated with the second frequency, the first sequence of first circuit values operable to be synchronized with the second sequence of second circuit values according to the first count values, the second count values, and the multiple.

16. A method for synchronizing output from a plurality of timed circuits, comprising:
receiving a reference clock signal at a first clock circuit and at a second clock circuit, generating a first clock signal from the reference clock signal at the first clock circuit, and generating a second clock signal from the reference clock signal at the second clock circuit;
receiving the first clock signal at a first timed circuit, the first clock signal associated with a first frequency, retrieving a first sequence of first circuit values from the first timed circuit, and inserting a plurality of first count values periodically into the first sequence of first circuit values using a first counter by inserting the first count values according to the first frequency;
receiving the second clock signal at a second timed circuit, the second clock signal associated with a second frequency, the first frequency corresponding to a multiple of the second frequency, retrieving a second sequence of second circuit values from the second timed circuit, and inserting a plurality of second count values periodically into the second sequence of second circuit values using a second counter by inserting the second count values according to the second frequency;
synchronizing the first sequence of first circuit values and the second sequence of second circuit values according to the first count values, the second count values, and the multiple by determining a first synchronizing count value of the first sequence of first circuit values, determining a second synchronizing count value of the second sequence of second circuit values, the second synchronizing count value substantially synchronous with the first synchronizing count value, synchronizing the first synchronizing count value and the second synchronizing count value, and synchronizing the first circuit values corresponding to a first count value with the second circuit values corresponding to a plurality of second count values according to the multiple; and
evaluating the first timed circuit and the second timed circuit in response to the first sequence of first circuit values synchronized with the second sequence of second circuit values.

* * * * *